US010104677B2

(12) United States Patent
Hassan (10) Patent No.: US 10,104,677 B2
(45) Date of Patent: Oct. 16, 2018

(54) CODE SHORTENING AT A SECONDARY STATION

(71) Applicant: Microsoft Technology Licensing, LLC, Redmond, WA (US)

(72) Inventor: Amer Hassan, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/457,602

(22) Filed: Mar. 13, 2017

(65) Prior Publication Data

US 2018/0263041 A1    Sep. 13, 2018

(51) Int. Cl.
*H04W 72/10* (2009.01)
*H04W 28/02* (2009.01)
*H04W 88/08* (2009.01)
*H04W 88/12* (2009.01)

(52) U.S. Cl.
CPC ....... *H04W 72/10* (2013.01); *H04W 28/0268* (2013.01); *H04W 88/08* (2013.01); *H04W 88/12* (2013.01)

(58) Field of Classification Search
CPC ............................. H04W 72/10; H04W 28/02
USPC ................................................. 455/451–454
See application file for complete search history.

(56) References Cited

U.S. PATENT DOCUMENTS

| 5,349,630 | A | 9/1994 | Sointula |
| 6,246,884 | B1 | 6/2001 | Karmi et al. |
| 6,507,926 | B1 | 1/2003 | Wright |
| 6,954,655 | B2 | 10/2005 | Rudrapatna et al. |
| 7,072,380 | B2 | 7/2006 | Ozluturk et al. |
| 8,155,023 | B2 | 4/2012 | Vedantham et al. |
| 8,370,729 | B2 * | 2/2013 | Ko ........................ H04L 1/0041 714/790 |
| 8,488,477 | B2 | 7/2013 | Li et al. |

(Continued)

FOREIGN PATENT DOCUMENTS

WO    2016105129 A1    6/2016

OTHER PUBLICATIONS

"AIS BS600", https://www.km.kongsberg.com/ks/web/nokbg0397.nsf/AllWeb/B3DA497CD0E00191C1257BC7003E8777/$file/Datasheet_AISBS600_july15.pdf?OpenElement, Retrieved on: Dec. 20, 2016, 2 pages.

(Continued)

*Primary Examiner* — Michael T Vu
(74) *Attorney, Agent, or Firm* — NovoTechIP International PLLC (57) ABSTRACT

A first base station operates as an auxiliary receiver to intercept portions of a data stream as one or more code shortened portions of the data stream, where a source device is sending the data stream on the uplink to a second base station. The data stream sent from the source device may be addressed to a destination device and may comprise code words. Upon intercepting the one or more code shortened portions of the data stream, the first base station may send the intercepted one or more code shortened portions of the data stream onward through a network to the destination device. The destination device may then use data redundancy provided by the intercepted one or more code shortened portions of the data stream and the original data stream for enhanced decoding of redundant portions of the data stream.

15 Claims, 6 Drawing Sheets

(56) References Cited

U.S. PATENT DOCUMENTS

| | | | |
|---|---|---|---|
| 8,630,255 | B1 | 1/2014 | Kunz et al. |
| 8,711,682 | B2 | 4/2014 | Weitkemper et al. |
| 2002/0122395 | A1* | 9/2002 | Bourlas .................. H04L 47/14 370/329 |
| 2004/0090932 | A1 | 5/2004 | Wei et al. |
| 2006/0223514 | A1 | 10/2006 | Weaver et al. |
| 2007/0082620 | A1 | 4/2007 | Zhang et al. |
| 2013/0316719 | A1* | 11/2013 | Mazzarese ............ H04L 1/0026 455/450 |
| 2014/0337682 | A1 | 11/2014 | Prodan |
| 2015/0092750 | A1 | 4/2015 | Huang et al. |
| 2015/0350896 | A1 | 12/2015 | Jeong et al. |

OTHER PUBLICATIONS

Oria, et al., "Performance Evaluation of Complementary Code Combining Diversity in DVB-SH", In Journal of Digital Signal Processing, vol. 21, Issue 6, Dec. 1, 2011, 7 Pages.

"International Search Report & Written Opinion Issued in PCT Application No. PCT/US2018/020993", dated Jun. 5, 2018, 19 Pages.

Yi, et al., "A Novel Dab Technique Using Code Combining Packet Combining", In Conference of IEE Colloquium. Turbo Codes in Digital Broadcasting—Could it Double Capacity?, Dec. 5, 1999, 8 Pages.

\* cited by examiner

| Bit location (308) | Code A (real number) (310) | Code C (real number) (312) | Input to decoder (314) |
|---|---|---|---|
| 1 | a1 | c1 | ac1 = combine (a1,c1) |
| 2 | a2 | Deletion | a2 |
| 3 | a3 | c3 | ac3 = combine (a3,c3) |
| 4 | a4 | c4 | ac4 = combine (a4,c4) |
| 5 | a5 | c5 | ac5 = combine (a5,c5) |
| 6 | a6 | Deletion | a6 |
| 7 | a7 | c7 | ac7 = combine (a7,c7) |

FIG. 3B

```
┌─────────────────────────────────────────────────────────┐  402
│ Destination device receives a1,a2,a3...an, and c1, x, c3...cm │
└─────────────────────────────────────────────────────────┘
                            │
                            ▼                              404
┌─────────────────────────────────────────────────────────┐
│ Destination device determines quality value for each bit position of │
│            a1,a2,a3...an and c1,x,c3...cm               │
└─────────────────────────────────────────────────────────┘
                            │
                            ▼                              406
┌─────────────────────────────────────────────────────────┐
│ For each bit position, y=1 to m of a1,a2,a3...am, and each bit │
│ position of c1,x,c3...cm, destination device sets acy to bit of ay or │
│              cy with highest quality value              │
└─────────────────────────────────────────────────────────┘
                            │
                            ▼                              408
┌─────────────────────────────────────────────────────────┐
│ Destination device inputs ac1,ac2,ac3...acm to decoder  │
└─────────────────────────────────────────────────────────┘
```

FIG. 4A

| Bit location (410) | Code A→ (bits) (412) | Quality* (real number) (414) | Code C→ (bits) (416) | Quality* (real number) (418) | Input to decoder (420) |
|---|---|---|---|---|---|
| 1 | a1 | Q1 | c1 | QC1>Q1 | ac1=c1 |
| 2 | a2 | Q2 | x | x | ac2=a2 |
| 3 | a3 | Q3 | c3 | QC3<Q3 | ac3=a3 |
| 4 | a4 | Q4 | c4 | QC4>Q4 | ac4=c4 |
| 5 | a5 | Q5 | c5 | QC5>Q5 | ac5=c5 |
| 6 | a6 | Q6 | x | x | ac6=a6 |
| 7 | a7 | Q7 | c7 | QC7<Q7 | ac7=a7 |

CODE SHORTENING AT A SECONDARY STATION

BACKGROUND

Wireless communications for media applications requires high quality of service (QoS) both on the uplink direction (from a source wireless device to a network eNodeB/access point (AP)), and, on the downlink direction (from a network eNodeB/AP to a destination wireless device). It is commonly understood that the downlink as the last link ("last mile", or "last access") is a bottleneck for performance. However, it may be the uplink of the source wireless device that is the limiting factor on performance. For example, uplink performance may suffer due to the limited transmission power that is available on battery powered portable devices, while the downlink may be provided abundant eNodeB/AP transmission power. Also, the fact that the eNodeB/AP is a device integrated into the network infrastructure may allow more efficient link management for the downlinks. Most networks, therefore, exhibit unbalanced performance between uplink and downlink.

SUMMARY

This summary is provided to introduce a selection of concepts in a simplified form that are further described below in the Detailed Description. This summary is not intended to exclusively or exhaustively identify key features or essential features of the claimed subject matter. Nor is it intended as an aid in determining the scope of the claimed subject matter.

In an implementation of the method, apparatus, and system of the disclosure, a first base station operates to provide enhanced quality of service (QoS) for uplink data stream transmissions sent from a source device to a second base station by intercepting code shortened portions of the uplink data stream as data that is redundant to the data in the data stream received by the second base station. The first base station operates as an auxiliary receiver to intercept one or more portions of the data stream as code shortened portions of the data stream. The code shortened portions may comprise shortened code words. Upon intercepting the code shortened portions of the data stream, the first base station may send the intercepted code shortened portions of the data stream onward through a network to a destination device. The destination device may then combine the intercepted code shortened portions of the data stream and the original data stream using redundancy/combinatorial techniques to enhance QoS. The data stream sent from the source device may be addressed to the destination device and may comprise code words or any other form of information bits.

By intercepting the data stream in code shortened form, the first base station is able to fully take advantage of periods when resources are available to the first base station. For example, the first base station may be a device that has a priority to receive certain transmissions. other than transmissions from the source device, and may only be available for short time periods to intercept portions of the source device data stream. Because of its limited bandwidth resources and its priority to receive from other devices, the auxiliary base station may only able to intermittently intercept one or more code shortened portions of the bits in the source device data stream. For example, the first base station may only be able to intercept incomplete portions of code words. By intercepting the data stream in code shortened form, the first base station is able to take advantage of short time periods of availability to fully take advantage of available bandwidth resources.

In an example, the source device may be transmitting a data stream including a code word comprising bits (b1, b2, ... b(n)) to the second base station and the second base station may send these bits onward to the destination device as bits (0, a1, a2, ... a(n)). The second base station may add the "0" bit at the beginning of the bits (a1, a2, ... a(n)) to indicate to any node along the path to the destination device that these bits should be routed with best efforts as the primary data stream. When the first base station has resources available, it may receive as portion of the hits in the source device data stream code word (b1, b2, ... b(n)). In doing this, the first base station receives as portion of bits (b1, b2, ... b(n)) as a "shortened code word" where the shortened code word may be missing one or more bits. For example, the auxiliary first base station may only be able to receive the shortened code word (c1, c2, ... c(n-k)) of the bits of the code word (b1, b2, ... b(n)) in the period when it has resources available. The auxiliary first base station then sends a data stream including shortened code word bits (1, c1, c2, ... c(n-k)) on to the destination device. The first base station may add the "1" bit at the beginning of the bits (1, c1, c2, ... c(n-k)) to indicate to any node along the path to the destination device that these bits are not highest priority and best effort need not be used to forward these bits onward. For example, the 1 bit may indicate to network routing nodes that the bits (1, c1, c2, ... c(n-k)) may be truncated if necessary or dropped if congestion occurs.

Appropriate error correction coding may be used in the source device encoder and destination device decoder so that the same decoder in the destination device may be used for decoding the original code word and redundant shortened code word, (0, a1, a2, ... a(n)) and (1, cl, c2, ... c(n-k)), respectively, to recreate the original data stream sent from the source device. For example, Reed-Solomon codes, trellis/convolutional codes, or Sequential decoding with a time stopping window may be used. Using one of these example coding techniques allows the decoder to still decode received code words that have been shortened and correctly decode the shortened code words, although error correction capability is degraded. In one implementation, the redundant portions of the original and the shortened code words, (a1, a2, ... a(n)) and (c1, c2, ... c(n-k)), respectively, may be combined at the destination device before being input to the destination device decoder. In another implementation, the two data streams may be combined after being input to the decoder. The destination device uses the additional redundancy added by the shortened code word (c1, c2, ... c(n-k)) during the combining to enhance overall performance and quality of the received data. Bits of the code word (a1, a2, ... a(n)) for which there are no corresponding bits in shortened code word (c1, c2, ... c(n-k)) ma be decoded conventionally, without using redundancy/combinatorial techniques.

In another implementation, the first base station may include a decoder that decodes the shortened code words (c1, c2, ... c(n-k)) at the first base station acting as the auxiliary receiver. The output of that decoder may then be sent to the destination device from the first base station. The destination device may then combine that decoder output with a decoder output generated from (a1, a2, ... a(n)) utilizing redundancy/combinatorial techniques

DETAILED DESCRIPTION

The system, method and apparatus will now be described by use of example embodiments. The example embodiments are presented in this disclosure for illustrative purposes, and not intended to be restrictive or limiting on the scope of the disclosure or the claims presented herein.

The technologies and techniques that are described herein provide implementations of systems, methods and apparatus that use a secondary base station as an auxiliary receiver for providing improved Quality of Service (QoS) for uplink data stream transmissions sent from a source device on the uplink to a primary base station. The secondary base station provides additional bandwidth for the uplink and utilizes code shortening techniques to maximize the total time during which the bandwidth may be provided. The secondary base station effectively intercepts one or more code shortened portions of the data stream, and provides the one or more code shortened portions of the data stream as redundant data to the destination device in parallel to the data stream provided by the primary base station. The one or more code shortened portions of the data stream may each comprise a shortened code word. The redundant data may be used at the destination device to improve QoS related parameters such as a bit error rate (BER), a packet error rate (PER), and/or data rate for the data stream sent from the source device.

The implementations provide advantages in situations where available additional bandwidth from the secondary base station is only intermittently available for short time periods, or is available in an unpredictable manner. For example, if the secondary base station has a primary function of collecting data from a number of sensors that transmit data randomly, or at certain predetermined time periods, the secondary base station may only have short time periods relative to the timing of the source device data stream in which to provide additional bandwidth for the uplink transmissions of the source device. Those short time periods may not allow the secondary base station to intercept one or more complete code words that are sent from the source device in the uplink data stream. However, the secondary base station may utilize those short time periods to intercept one or more code shortened portions of the data stream as shortened code words. When the appropriate encoder and decoder are used in the source and destination devices, respectively, the one or more code shortened portions of the data stream may be correctly decoded at the destination device and provide data redundancy for the hits that are included in both the code shortened portions of the data stream and the original data stream sent through the primary base station.

In one example, the secondary base station may be implemented as an access point that has a primary function to receive data from interact of things (IoT) devices. For example, the secondary base station may be a Wi-Fi access point located in an area where IoT devices are collecting, updating, and sending data to the cloud via the secondary base station. The IoT devices may be sending the data at scheduled times or randomly, as needed. When one or more other devices, other than the IoT devices, are in the coverage area of the secondary base station and sending data to the primary base station on the uplink, the secondary base station may make itself available as an auxiliary receiver to provide additional uplink bandwidth to the other devices. The secondary base station may provide the function as an auxiliary receiver during the time periods when it is not receiving data from the IoT devices that is targeted for the secondary base station. The secondary base station may attempt to maximize the additional bandwidth provided to the one or more other devices by providing redundant data, even in relatively short time periods by using code shortening techniques. The secondary base station may function as the auxiliary receiver in a way that is transparent to the primary base station and/or source device. In other implementations, the secondary base station may communicate and coordinate with the primary base station to exchange control information used in providing services as an auxiliary receiver.

In other examples, the function of an auxiliary receiver that provides additional bandwidth for enhanced uplink QoS to a source device using code shortening techniques may be implemented in any other type of base station. For example, the functions of the auxiliary receiver may be implemented in base stations such as Wi-Fi access points, cellular base stations, 5G base stations, 5G micro-base stations, or any other receiver apparatus that may connect a source device to a network. These base stations may also operate to provide their normal functions, for example, providing uplink and/or downlink communications to devices, in addition to functioning as an auxiliary receiver when bandwidth is available. The base stations may be capable of operating according to one or more wireless protocols and may operate in a different protocol when operating as an auxiliary receiver as compared to a normal mode of operation.

Figure 1A:
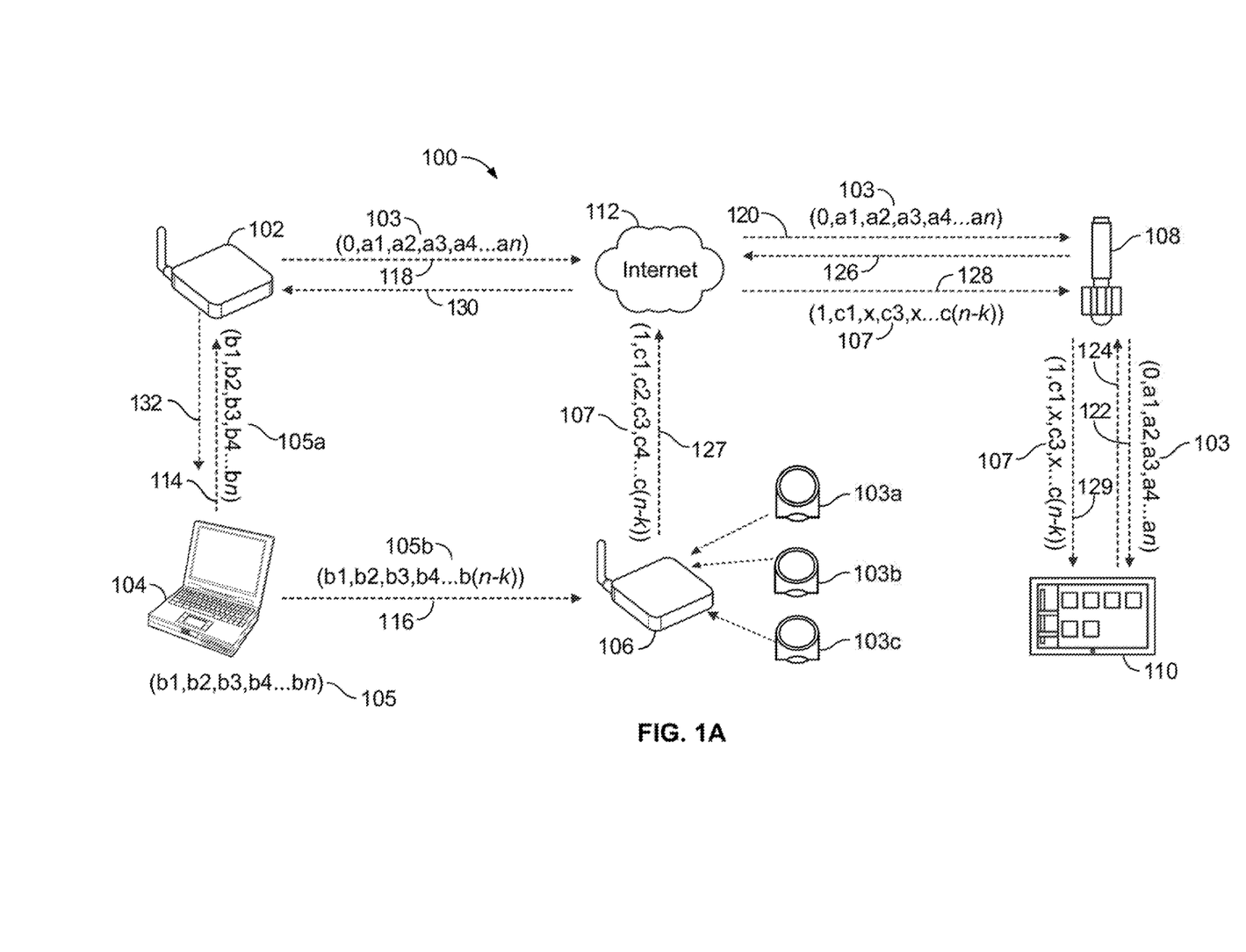
FIG. 1A is a diagram illustrating an example system including a base station operable as an auxiliary receiver according to the embodiments.

FIG. 1A is a diagram illustrating an example system including a base station operable as an auxiliary receiver according to the embodiments. System 100 includes device 104, base station 102, base station 106, IoT sensor devices 103$a$, 103$b$, and 103$c$, base station 108, and device 110. In FIG. 1A, device 104 is shown generating a data stream comprising bits (b1, b2, ... b(n)) 105. The bits (b1, b2, ... b(n)) may represent a code word of a plurality of code words. Base station 102 receives bits (b1, b2, ... b(n)) 105$a$ on link 114. Base station 102 then sends a data stream comprising bits (0, a1, a2, ... a(n)) 103, (where an=bn, as received at base station 102) to the interact 112 on link 118. The data stream comprising bits (0, a1, a2, ... a(n)) 103 is then sent from the interact 112 to base station 108 on link 120, and from base station 108 to destination device 110 on link 122. At substantially the same time, base station 106 may function as an auxiliary receiver to intercept/receive bits (b1, b2, . . . b(n-k)) 105*b* on uplink 116 as a code shortened version of bits (b1, b2, . . . b(n)). Uplink 116 and uplink 114 represent the same channel. Base station 106 then sends a data stream comprising bits (1, c1, c2, . . . c(n-k)) 107, (where cn=bn, as received at base station 106) to the internet 112 on link 127. The data stream comprising bits (1, c1, c2, . . . c(n-k)) 107 is then sent from the internet 112 to base station 108 on link 128, and from base station 108 to destination device 110 on link 129. When not operating as an auxiliary receiver, base station 106 may receive and collect data from IoT sensor devices 103*a*, 103*b*, and 103*c*. In one example, device 104 may be involved in a media communications session with device 110, for example, in a video and/or audio call. In that example, device 110 may send a data stream on links 124, 126, 130, and 132, through base station 108, interact 112, and base station 102, to device 104.

Figure 1B:
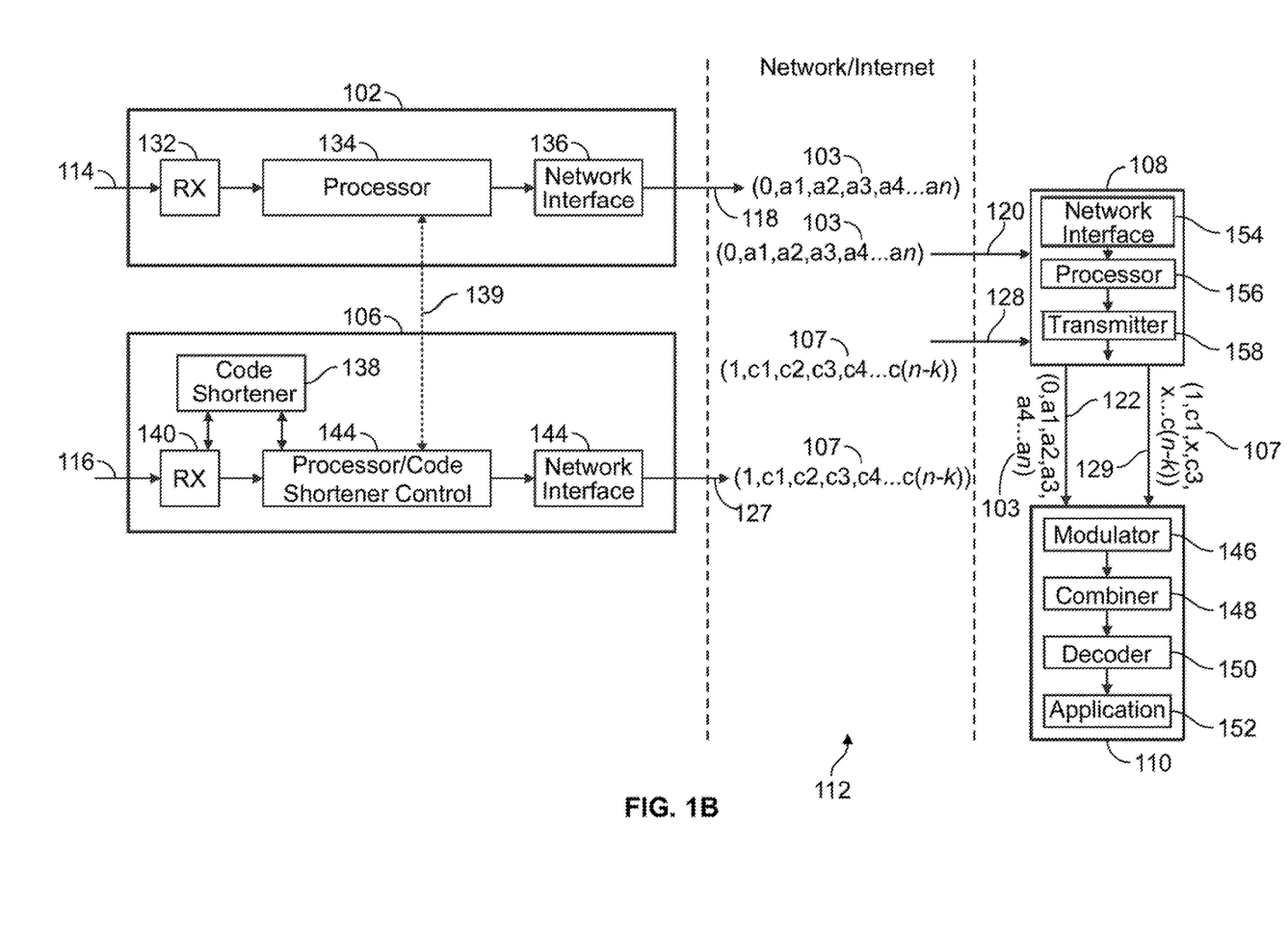
FIG. 1B is a block diagram illustrating portions of the devices in the system of FIG. 1.

FIG. 1B is a block diagram illustrating example portions of the devices in the system of FIG. 1A. FIG. 1B shows base station 106 comprising receiver (RX) 140, code shortener 138, processor/code shortening controller 144, network interface 144, base station 102 comprising receiver (RX) 132, processor unit 134, and network interface 136. Also, base station 108 is shown comprising network interface 154, processor 156, and transmitter 158. FIG. 1B also shows base station 108 comprising network interface 154, processor 156, and transmitter 158, and destination device 110 comprising modulator 146, combiner 148, decoder 150, and application 152.

Figure 2:
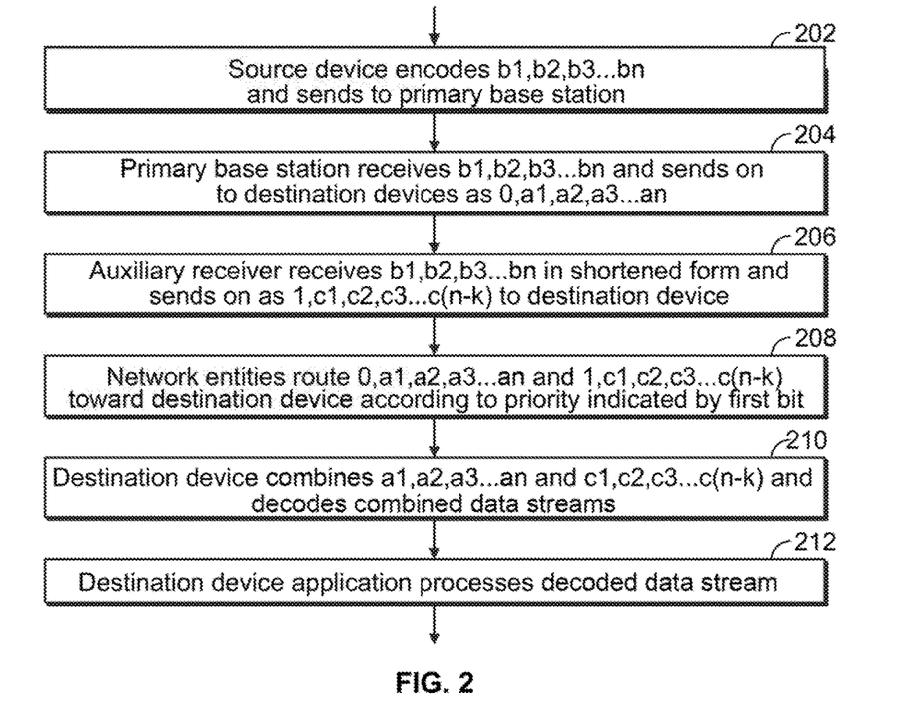
FIG. 2 is a flow diagram showing example operations performed by devices in a system that includes a base station operating as an auxiliary receiver.

FIG. 2 is a flow diagram showing example operations performed by devices in a system that includes a base station operating as an auxiliary receiver. The process of FIG. 2 may be explained with reference to FIGS. 1A and 1B, The process of FIG. 2 begins at 202. At 202 source device 104 encodes a data stream including bits (b1, b2, . . . b(n)) 105 and sends the encoded data stream on uplink 114 to primary base station 102. The bits (b1, b2, . . . b(n)) 105 may comprise a code word of length n. The encoding may be done using an encoding method that allows a decoder to still receive code words that have been shortened and correctly decode the shortened code words. For example, a Reed-Solomon code or trellis, convolutional code may be used. Also, sequential coding with a time stopping window may be used.

At 204, primary base station 102 receives the transmitted data stream as bits (b1, b2, . . . b(n)) 105*a* from uplink 114 at receiver (RX) 132. Processor 134 then adds a "0" bit to the beginning of the bits (b1, b2, . . . b(n)) and sends a data stream comprising bits (0, a1, a2, . . . a(n)) 103, where an=bn, as received by receiver (RX) 134, through network interface 136 to the internet/network on link 118. The 0 bit added at the beginning of the bits may be used as an indicator to devices/routers in the internet/network that these bits should have priority relative to other bits when routing decisions need to be made within the internet/network.

At 206, base station 102, acting as an auxiliary receiver, intercepts/receives the transmitted bits (b1, b2, . . . b(n-k)) 105*b* from uplink 116 (which comprises the same channel uplink 114) at receiver (RX) 140. The bits (b1, b2, . . . b(n-k)) 105*b* comprise a code shortened thrill of the bits (b1, b2, . . . b(n)) 105 actually transmitted by source device 104. In other words, receiver (RX) 140 does not receive the complete set of bits (b1, b2, . . . b(n)) 105. The bits (b1, b2, . . . b(n-k)) may comprise the code word (b1, b2, . . . b(n)) as shortened to a code word of length (n-k). The shortening of the bits (b1, b2, . . . b(n)) 105 to the bits (b1, b2, . . . b(n-k)) 105*b* may be controlled by processor/code shortening controller 144 and code shortener 138 controlling receiver (RX) 140 to receive the appropriate bits based on the time available for receiving the shortened code word. Processor/code shortening controller 144 then adds a "1" bit to the beginning of the bits (b1, b2, . . . b(n-k)) and sends a data stream comprising the bits (1, c1, c2, . . . c(n-k)) 107, where cn=bn as received by receiver (RX) 140, though network interface 144 to the interact/network on link 127.

The code shortening at 206 may be done according to a bandwidth allocation assigned by processor/code shortening controller 144 for providing redundancy to the uplink transmissions of device 104. For example, the bandwidth allocation may be based on free periods of time available to base station 106, in which base station 106 is not receiving data from IoT devices 103*a*-103*c*. During these free periods of time, processor/code shortening controller 144 may control code shortener 138 and receiver (RX) 140 to receive any portions of code words, such as code word (b1, b2, . . . b(n)), that it is able to receive as shortened code words from source device 104 while base station 106 functions as an auxiliary receiver. If able, base station 106 may also intercept a data stream without code shortening. In this example, base station 102 and base station 106 may communicate though link 139 to exchange information needed by base station 106 to receive the appropriate transmissions from the appropriate source device 104. Base station 102 may also send a request to base station 106 on link 139 to request that base station 106 operate as an auxiliary receiver and provide the additional bandwidth when base station 106 is able to do so.

In another example, base station 106 may scan and receive transmissions for one or more devices whenever it has available bandwidth to provide data redundancy on network uplinks. Base station 106 may then choose the uplinks to which it provides the data redundancy. For example, the choice of which uplinks to provide the data redundancy to may be a random choice or may be based on input from a network controller or base station 102. In this example, base station 106 may operate as an auxiliary receiver transparently to other devices/base stations in the network.

At 208, the data stream comprising the bits (0, a1, a2, a3 . . . an) and the data stream comprising the bits (1, c1, c2, c3 . . . c(n-k)) are routed by network entities through the internet/network 112 toward destination device 110. Network interface 154 of base station 108 receives bits (0, a1, a2, a3 . . . an) on link 120 and bits (1, c1, c2, c3 . . . c(n-k)) on link 128. Network entities, such as routers, may route bits (0, a1, a2, a3 . . . an) and bits (1, c1, c2, c3 . . . c(n-k)) according to the priority indicated by the added first bit of each bit string. For example, bits (1, c1, c2, c3 . . . c(n-k)) will receive a lower priority than bits (0, a1, a2, a3 . . . an) relative to other bits flowing through the network, in queuing for routing at network nodes. Bits (1, c1, c2, c3 . . . c(n-k)) also will be more likely to be truncated or dropped than bits (0, a1, a2, a3 . . . an) if network congestion/delay occurs. Processor 156 then controls transmitter 158 to transmit bits (0, a1, a2, a3 . . . an) and bits (1, c1, c2, c3 . . . c(n-k)) to destination device 110 on downlink 122.

At 210, destination device 110 receives the data stream comprising bits (0, a1, a2, a3 . . . an) 103 on downlink 122 and demodulates the bits (0, a1, a2, a3 . . . an) at demodulator 146. Destination device 110 also receives the data stream comprising the bits (1, c1, c2, c3 . . . c(n-k)) on downlink 122 and demodulates the bits (1, c1, c2, c3 . . . c(n-k)) at demodulator 146. As part of operation 210, combiner 148 may determine that bits (a1, a2, a3 . . . an) and bits (c1, c2, c3 . . . c(n-k)) are from the same source and may be combined. For example, combiner 148 may monitor the source address for each of the two data streams to determine that the data streams are from the same source device. In another example, a bit or bits may be inserted into the bits (c1, c2, c3 . . . c(n-k)) at base station 106 to indicate to destination device 110 that (c1, c2, c3 . . . c(n-k)) are redundant bits. Any other method that may indicate that the bits (a1, a2, a3 . . . an) and bits (c1, c2, c3 . . . c(n-k)) are redundant to destination device 110 may also be used. Destination device 110 then combines bits (a1, a2, a3 . . . an) and bits (c1, c2, c3 . . . c(n-k)) at combiner 148. For example, at may be combined with c1, a2 may combined with c3, up to a(n-k) being combined with c(n-k). The combining may be done using, for example, selective combining, maximal ration combining, or qual again combining. If a bit cx was not received by destination device 110 as part of the code shortening, then the bit ax is used for bit positon x. Each bit location is processed similarly. The combined data bits are then input to decoder 150 and decoded. For example, Reed-Solomon code or trellis/convolutional decoding may be used. Also, sequential decoding with a time stopping window may be used. Next, at 212, application 152 of destination device 110 processes the data stream comprising the combined bits for use by the application 152.

In other implementations, the operation of the adding of bits that indicate priority for routine, for example the "0" in (0, a1, a2, a3 . . . an) and the "1" in (1, c1, c2, c3 . . . c(n-k).)) may be omitted. In other examples, the added priority bits may be of any number and of any form, as long as the priorities of the two data streams may be distinguished.

Figure 3A:
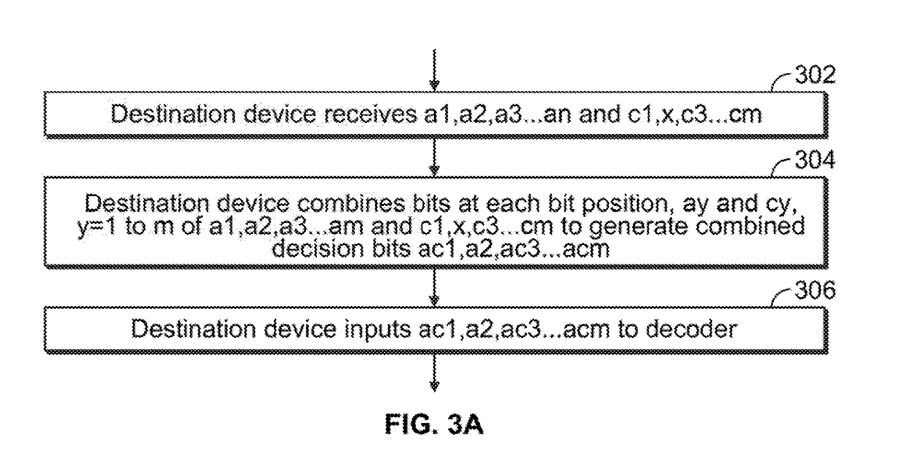
FIG. 3A is a flow diagram illustrating example operations performed by a destination device when receiving a redundant code shortened data stream.

FIG. 3A is a flow diagram illustrating example operations performed by a destination device when receiving a redundant code shortened data stream. FIG. 3A shows an implementation of operations that may be performed in destination device 110 at operation 210 of FIG. 2.

The process begins at 302 where destination device 110 receives bits (a1, a2, a3, . . . an) and bits (c1, x, c3 . . . cm), where m=(n-k), "x" in a bit position indicates that the particular bit was not received. For example, the bit may have been truncated during traverse through the network. At 304, destination device 110 combines bits at each bit position ay and cy, y=1 to m, of the bits (a1, a2, a3 . . . an) and the bits (c1, c2, c3 . . . cm) to generate combined decision bits (ac1, ac2, ac3 . . . acm). Next at 306, combiner 146 provides the combined bits (ac1, ac2, ac3 . . . acm) to decoder 150.

Figure 3B:
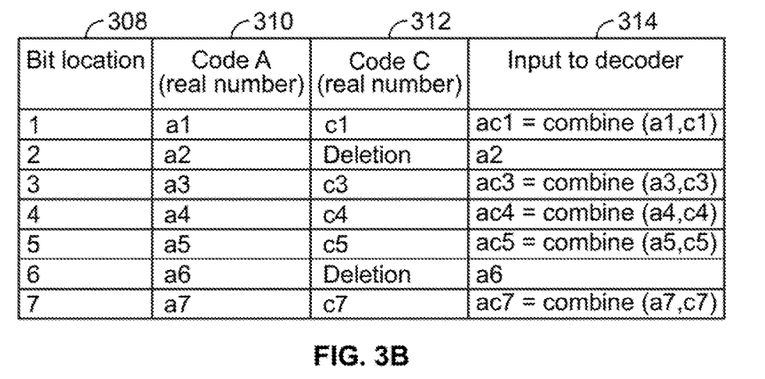
FIG. 3B is table showing an example of combining data streams in a destination device.

FIG. 3B is table showing an example of combining redundant bits in a destination device. The combining shown FIG. 3B may be used at operation 304 of FIG. 3A. For each bit location at column 308 in the table, FIG. 3B shows that if both the code A bit (column 310) and code C bit (column 312) are received, then in column 314, the combined bit acn=combine (an, cn) at each row, n=1 . . . 7, for input to the decoder 150, where combine (an, cn) is the combination function. If a bit is not received, for example, bit ex, then ax is taken as the result. Combine (x, y) may be a combination function based on selective combining, maximal ration combining, or qual again combining.

Figure 4A:
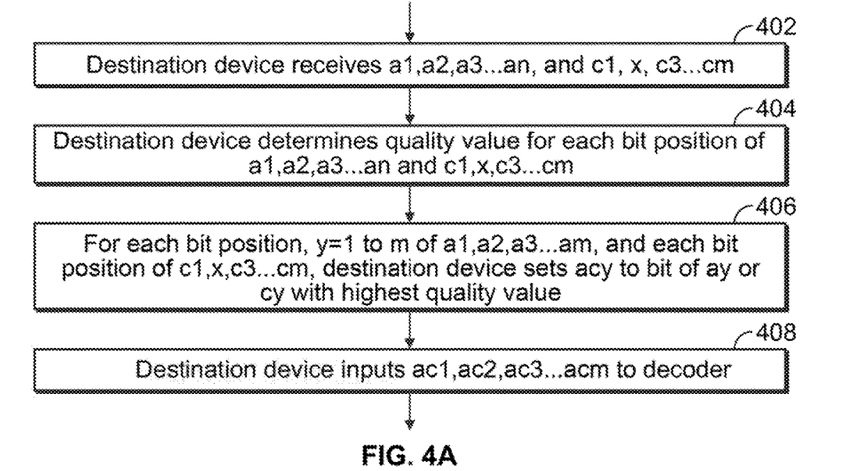
FIG. 4A is a now diagram illustrating further example operations performed by a destination device when receiving a redundant code shortened data stream.

FIG. 4A is a flow diagram illustrating further example operations performed by a destination device when receiving a redundant code shortened data stream. FIG. 4A shows another implementation of operations that may be performed in destination device 110 at operation 210 of FIG. 2.

The process begins at 402 where destination device 110 receives bits (a1, a2, a3 . . . an) and bits (c1, x, c3 . . . cm), where m=(n-k). An "x" in a bit position indicates that the particular bit was not received. For example, the bit may have been truncated during traverse through the network. At 404, during demodulation of bits (a1, a2, a3 . . . an) and bits (c1, x, c3 . . . cm), demodulator 146 of destination device 110 assigns a quality value to each bit. For example, bit a1 is assigned a quality value based on the confidence level of the demodulation that a1 is a 1 or a 0, c1 is assigned a quality value based on the confidence level of the demodulation that c1 is a 1 or a 0, and so on for all received bits up to bit position m.

Next, at 406 for each bit position ay, y=1 to m, of (a1, a2, a3 . . . am) and each bit position cy, y=1 to m, of (c1, x, c3 . . . cm), destination device sets acy, y=1 to m, to the value of the bit ay or cy with the higher quality value. If a bit is missing from either bits (a1, a2, a3 . . . am) or bits (c1, x, c3 . . . cm) the non-missing bit from the other bit set is used for that position. Next, at 408, combiner 146 provides the combined bits (ac1, ac2, ac3, . . . acm) to decoder 150.

Figure 4B:
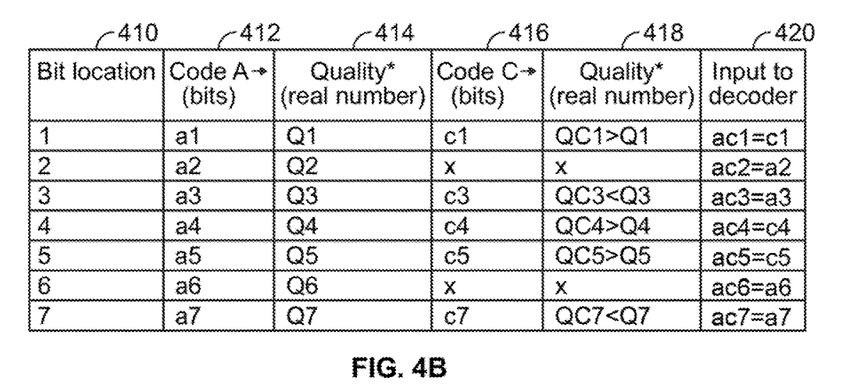
FIG. 4B is table showing another example of combining data streams in a destination device.

FIG. 4B is another table showing an example of combining redundant bits in a destination device. The combining shown in FIG. 4B may be used at operation 406 of FIG. 4A. For each row (bit location) of column 410 in the table, FIG. 4B shows that the code A bit (column 412) and code C bit (column 416) are assigned a quality value, Quality 414 and Quality 418, respectively. The bits (a1, a2, a3, . . . am) are combined at each location with the bits (c1, x, c3 . . . cm) by taking the bit with the highest quality value at that location to create the input to the decoder at column 420. For example, at bit location 1, a1 has quality value Q1 and c1 has quality value QC1, where QC1>Q1, so c1 is taken as bit ac1. In another example, at bit location 3, a3 has quality value Q3 and c3 has quality value QC3, where QC3<Q3, so a3 is taken as bit ac3. If a bit has not been received, for example bit c2, then a2 is taken as the result. The bits of column 420 are then input to decoder 150 as bits (ac1, ac2, ac3 . . . acm).

Figure 5:
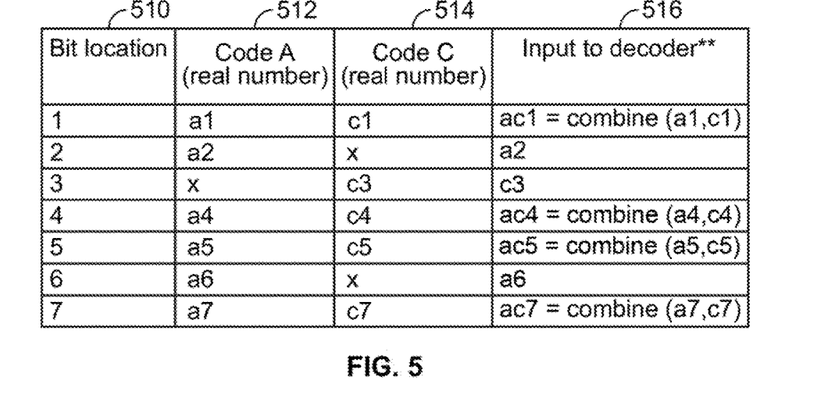
FIG. 5 is table showing a further example of combining data streams in a destination device.

FIG. 5 is table showing a further example of combining redundant bits in a destination device. The table of FIG. 5 illustrates a combining method similar to that shown FIG. 3A, with columns 510, 512, 514, and 516 of FIG. 5 corresponding, respectively, to columns 308, 310, 312, and 314, of FIG. 3A, except that in the method of FIG. 5 a bit ax may be missing or have been deleted from (a1, a2, . . . am) of column 512. In this case the bit cx is used in the bit location x for input to the decoder. This is shown for the example of bit location 3 in FIG. 5.

Figure 6:
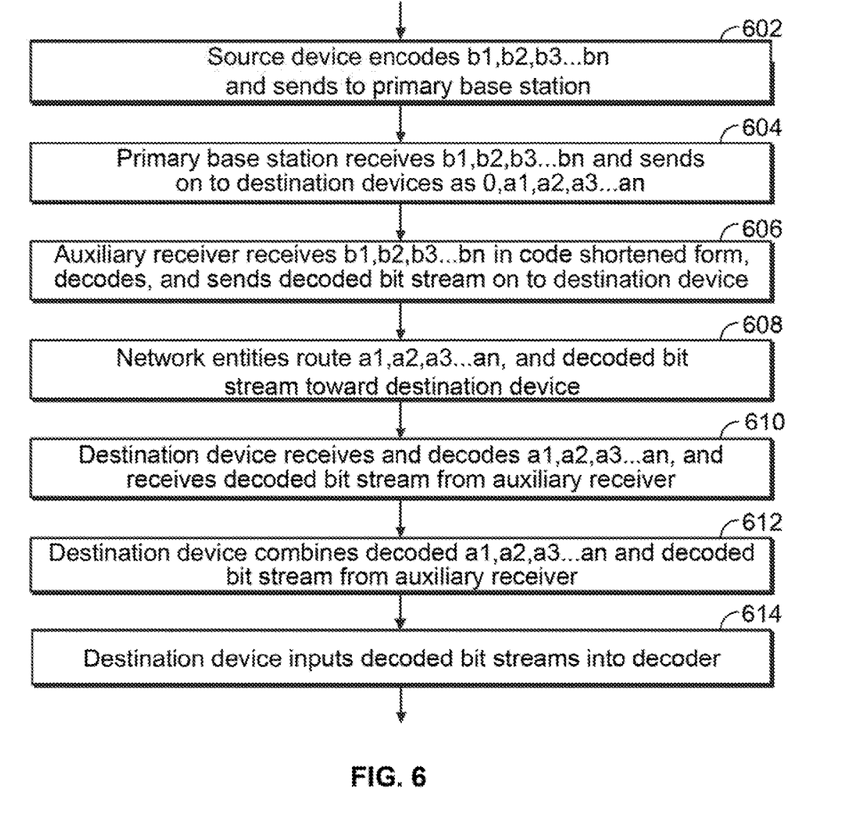
FIG. 6 is a flow diagram showing further example operations performed by devices in a system that includes a base station operating as an auxiliary receiver.

FIG. 6 is a flow diagram showing further example operations performed by devices in a system that includes a base station operating as an auxiliary receiver. FIG. 6 may be used as an alternative implementation of FIG. 2. In the process of FIG. 6, the decoding of the code shortened data bits (c1, c2, c3 . . . c(n-k)) is performed in base station 106 as part of its auxiliary receiver functions. The process of FIG. 6 may be explained with reference to FIG. 1A, except the data streams sent from base station 106 to destination device 110 may differ in FIG. 6.

The process of FIG. 6 begins at 602. At 602, source device 104 encodes data stream comprising bits (b1, b2, . . . b(n)) 105 and sends the encoded data stream on uplink 114 to primary base station 102. The bits (b1, b2, . . . b(n)) 105 may comprise a code word of length n. The encoding may be done using an encoding method technique that allows a decoder to still decode received code words that have been shortened and correctly decode the shortened code words. For example, a Reed-Solomon code or trellis/convolutional code may be used. Also, sequential coding with a time stopping window may be used.

At 604, primary base station 102 receives the transmitted bits as (b1, b2, . . . b(n)) 105a from uplink 114. Base station 102 then sends a data stream comprising the bits (a1, a2, . . . a(n)) 103, where an=bn, as received at base station 102, through the internet/network 112 on link 118 to destination device 110.

At 606, base station 106, acting as an auxiliary receiver, receives the transmitted bits (b1, b2, . . . b(n-k)) 105b from uplink 114 at receiver (RX) 140. The bits (b1, b2, . . . b(n-k)) 105b comprise a code shortened form of the bits (b1, b2, . . . b(n)) 105 that were actually transmitted by source device 104. In other words, receiver (RX) 140 does not receive the complete set of bits (b1, b2, . . . b(n)) 105. The bits (b1, b2, . . . b(n-k)) may comprise the code word (b1, b2, . . . b(n)) as shortened to a code word of length (n-k). Base station 106 then decodes the code shortened bits as words of length (n-k) to generate decoded bits (c1, c2, . . . c(n)). The decoding may be done using the same decoder used in source device 104 to generate the bits (b1, b2, . . . b(n)) from an original source data stream. The decoded bits (c1, c2, . . . c(n)) comprises a version of the original source data stream that has been encoded into one or more code words (b1, b2, . . . b(n)) and then decoded from one or more shortened code Words (b1, b2, . . . b(n-k)).

At 608, the data stream comprising the bits (a1, a2, a3 . . . an) and the data stream comprising the decoded bits (c1, c2, . . . (n)) from the auxiliary receiver are routed by network entities through the internet/network 112 toward destination device 110.

At 610, destination device 110 receives the data stream comprising bits (a1, a2, a3 . . . an) 103 on downlink 122 and decodes the bits (a1, a2, a3 . . . an). Destination device 110 also receives the data stream comprising the decoded bits (c1, c2, . . . c(n)) sent from base station 106. Then, at 612. destination device 110 combines the decoded bits (a1, a2, a3 . . . an) and the decoded bits (c1, c2, . . . c(n)) sent from base station 106. The combining may be done using, for example, selective combining, maximal ration combining, or qual again combining. Then, at 614, destination device provides the bits combined at 612 to the appropriate application.

Figure 7:
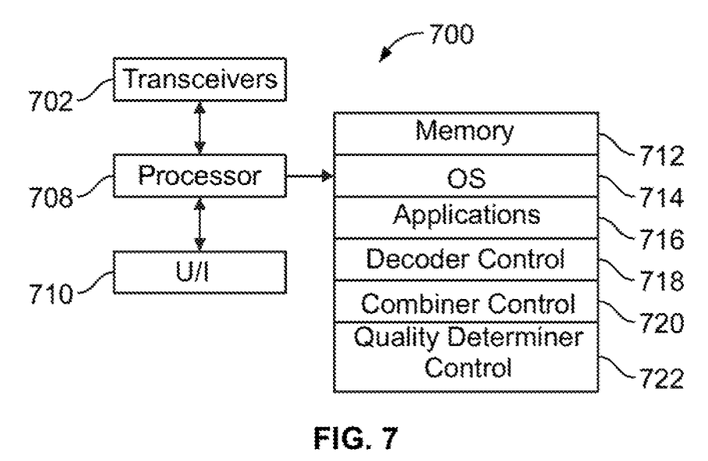
FIG. 7 therein is a simplified block diagram of an example device which may be implemented to receive a data stream and a code shortened version of the data stream; and, FIG. 8 is a simplified block diagram showing an example base station operable as an auxiliary receiver of a code shortened data stream.

Referring now to FIG. 7, therein is a simplified block diagram of an example device 700 which may be implemented to receive a data stream and a code shortened version of the data stream. Device 700 represents an example implementation of destination device 110 of FIGS. 1A and 1B. Device 700 includes processor 708, transceivers 702, user interface (UI) 710, and memory/storage 712 that includes code and programs/instructions for applications 716, decoder control 718, combiner control 720, and quality determiner control 722. Memory/storage 712 also includes code and programs/instructions for operating system (OS) 714 that control overall operation of device 700. In an implementation, execution of decoder control 718, combiner control 720, and quality determiner control 722 programs causes processor 708 to implement operations that cause device 700 to operate as destination device according to the processes of FIGS. 2, 3A, 4A or 6.

Figure 8:
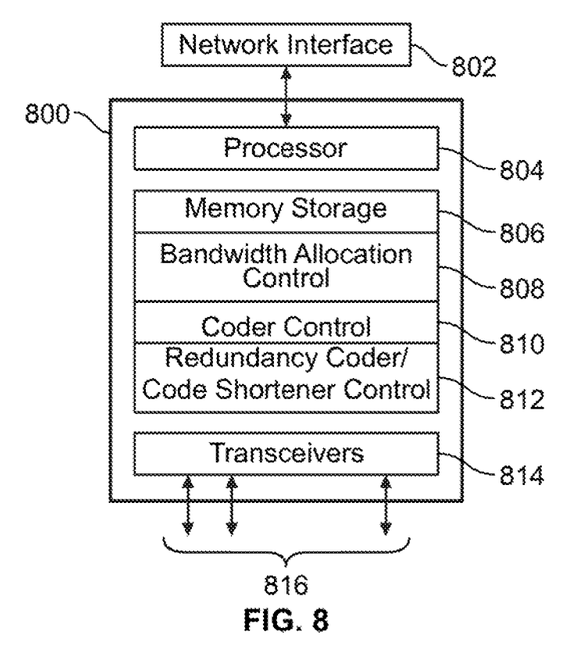

Referring now to FIG. 8, therein is a simplified block diagram showing an example base station 800 which may operate as an auxiliary receiver for a code shortened data stream. Base station 800 represents a possible implementation of base station 106 of FIGS. 1A and 1B. Base station 800 includes processor 804, network interface 802, transceivers 814, and memory/storage 806 that includes code and program/instructions for bandwidth allocation control 808, coder control 810 and, code shortening control 812. Base station 800 connects to a backend network over network interface 802. Network interface 802 may be any type of interface, wireless or otherwise, to a network, for example the internet. Processor 804 may comprise one or more processors, or other control circuitry or any combination of processors and control circuitry that provide overall control of base station 800 according to the disclosed embodiments. Transceivers 814 provide the capability to communicate with wireless devices such as wireless device 104 and IoT sensors 105. Memory 706 may be implemented as any type of as any type of computer readable storage media, including non-volatile and volatile memory.

In an implementation, execution of bandwidth allocation control programs 808 and code shortening control programs 812 causes processor 804 to implement operations that cause base station 800 to operate as an auxiliary receiver that utilizes available bandwidth to intercept data streams and/or code shortened portions of a data stream sent from a source device to provide data redundancy for an uplink according to the disclosed implementations.

The example embodiments disclosed herein may be described in the general context of processor-executable code or instructions stored on memory that may comprise one or more computer readable storage media (e.g., tangible non-transitory computer-readable storage media such as memory 712 or 806). As should be readily understood, the terms "computer-readable storage media" or "non-transitory computer-readable media" include the media for storing of data, code and program instructions, such as memory 712 or 806, and do not include portions of the media for storing transitory propagated or modulated data communication signals.

While the functionality disclosed herein has been described by illustrative example using descriptions of the various components and devices of embodiments by referring to functional blocks and processors or processing units, controllers, and memory including instructions and code, the functions and processes of the embodiments may be implemented and performed using any type of processor, circuit, circuitry or combinations of processors and/or circuitry and code. This may include, at least in part, one or more hardware logic components. For example, and without limitation, illustrative types of hardware logic components that can be used include field programmable gate arrays (FPGAs), application specific integrated circuits (ASICs), application specific standard products (ASSPs), system-on-a-chip systems (SOCs), complex programmable logic devices (CPLDs), etc. Use of the term processor or processing unit in this disclosure is mean to include all such implementations.

The disclosed embodiments include an apparatus comprising a receiver, one or more processors in communication with the receiver, and, memory in communication with the one or more processors, the memory comprising code that, when executed, causes the one or more processors to control the apparatus to receive a first data stream, the first data stream originating at a source device and sent to a destination device, receive a second data stream from the network, wherein the second data stream is a code shortened version of the first data stream originating at the source device, combine the first data stream and the second data stream based on the redundancy provided by the second data stream to generate a third data stream, and, provide the third data stream for processing at the destination device. The code may be further executable to cause the one or more processors to control the apparatus to combine the first data stream and the second data stream by controlling the apparatus to decode the first data stream to generate a fourth data stream, decode the second data stream to generate a fifth data stream, and, combine the fourth data stream and the fifth data stream based on the redundancy provided by the fifth data stream to generate the third data stream. The code may be further executable to cause the one or more processors to control the apparatus to combine the first data stream and the second data stream by controlling the apparatus to combine the first data stream and the second data stream based on the redundancy provided by the second data stream to generate a fourth data stream, and, decode the fourth data stream to generate the third data stream.

A plurality of bits of the first data stream and a plurality of bits of the second data stream may each be assignable to one of a plurality of bit locations, and the code may be further executable to cause the one or more processors to control the apparatus to combine the first data stream and the second data stream by controlling the apparatus to determine at least one selected bit location of the plurality of bit locations in the second data stream for which no bit was received, combine the bits of the first data stream and the bits of the second data stream at each of the plurality of bit locations based on a selected combining method to generate the fourth data stream, wherein the hits of the first data stream in the selected bit location in the first data stream are placed in the selected bit location in the fourth data stream. A plurality of bits of the first data stream and a plurality of bits of the second data stream may each be assignable to one of a plurality of bit locations, and, and the code may be further executable to cause the one or more processors to control the apparatus to combine the first data stream and the second data stream by controlling the apparatus to determine a quality value for each bit of the first data stream and second data stream, and, combine the bits of the first data stream and the bits of the second data stream by taking the bit having the higher quality value of the bits of the first data stream or second data stream at each of the plurality of bit locations and placing the bit having the higher quality value in each of the plurality of bit locations in the fourth data stream. The apparatus may be implemented in the destination device. The code may be further executable to cause the one or more processors to control the apparatus to combine the first data stream and the second data stream by controlling the apparatus to decode the first data stream to generate a fourth data stream using a type of decoder used at the source device to encode the first data stream, decode the second data stream to generate a fifth data stream using the type of decoder used at the source device to encode the first data stream, and, combine the fourth data. stream and the fifth data stream based on the redundancy provided by the fifth data stream to generate the third data stream. The code may be further executable to cause the One or more processors to control the apparatus to determine that the first data stream and the second data stream originate at the same source device using a source address.

The disclosed embodiments also include a first base station comprising a receiver, a transmitter, one or more processors in communication with the receiver and transmitter, and, memory in communication with the one or more processors, the memory comprising code that, when executed, causes the one or more processors to control the first base station to determine that the first base station has available bandwidth to receive at least a portion of a data stream sent from a source device to a second base station on a wireless channel, wherein the data stream is intended for a destination device, intercept the at least a portion of the data stream as a code shortened form of the data stream, wherein the size of at least one the portion of the data is base at least on the available bandwidth, and, send the code shortened form of the data stream to the destination device. The code may be further executable to cause the one or more processors to control the auxiliary base station to determine that the auxiliary base station has available bandwidth to receive the at least a portion of a data stream by controlling the first base station to determine that the first base station has available bandwidth that is not being used for receiving data sent to the first base station, and, in response to the determination that the first base station has available bandwidth, scan to locate the wireless channel and intercept the at least a portion of the data stream. The code may be further executable to cause the one or more processors to control the auxiliary base station to determine that the first base station has available bandwidth to intercept at least a portion of a data stream by controlling the first base station to receive a request for bandwidth, determine that the first base station has available bandwidth, and, in response to determine that the first base station has available bandwidth, scan to locate the wireless channel and intercept the at least a portion of the data stream. The code may be further executable to cause the one or more processors to control the first base station to receive the request for bandwidth from the second base station. The code may be further executable to cause the one or more processors to control the first base station to receive the request for bandwidth from a network controller. The code may be further executable to cause the one or more processors to control the first base station to insert an indication in the code shortened form of the data stream sent to the destination device, wherein the indication identifies the code shortened form of the data stream as having a lower network priority than the data stream sent from the source device to the primary base station.

The disclosed embodiments further include a first base station comprising a receiver, a transmitter, one or more processors m communication with the receiver and transmitter, and, memory in communication with the one or more processors, the memory comprising code that, when executed, causes the one or more processors to control the first base station to determine that the first base station has available bandwidth to intercept at least a portion or a data stream sent from a source device to a second base station on a wireless channel, wherein the data stream is intended for a destination device, intercept the at least a portion of the data stream as a code shortened form of the data stream, wherein the size of the at least a portion is based at least on the available bandwidth, decode the code shortened form of the data stream to generate a decoded data stream, and, send the decoded data stream to the destination device. The code may be further executable to cause the one or more processors to control the first base station to determine that the first base station has available bandwidth to intercept at least a portion of a data stream by controlling the first base station to determine that the first base station has available bandwidth that is not being used for receiving data sent to the first base station, and, in response to the determination that the first base station has available bandwidth, scan to locate the wireless channel and intercept the at least a portion of the data stream. The code may be further executable to cause the one or more processors to control the auxiliary base station to determine that the first base station has available bandwidth to intercept a portion of a data stream by controlling the first base station to receive a request for bandwidth, determine that the first base station has available bandwidth, and, in response to determine that the first base station has available bandwidth, can to locate a channel and intercept the at least a portion of the data stream. The code may be further executable to cause the one or more processors to control the first base station to receive the request for bandwidth from the second base station. The code may be further executable to cause the one or more processors to control the first base station to receive the request for bandwidth from a network controller. The code may be further executable to cause the one or more processors to control the first base station to insert an indication in the decoded data stream sent to the destination device, wherein the indication identifies the decoded data stream as having a lower network priority than the coded data stream.

Although the subject matter has been described in language specific to structural features and/or methodological acts, it is to be understood that the subject matter defined in the appended claims is not necessarily limited to the specific features or acts described above. Rather, the specific features and acts described above are disclosed as example embodiments, implementations, and forms of implementing the claims and these example configurations and arrangements may be changed significantly without departing from the scope of the present disclosure. Moreover, although the example embodiments have been illustrated with reference to particular elements and operations that facilitate the processes, these elements, and operations may be combined with or, be replaced by, any suitable devices, components, architecture or process that achieves the intended functionality of the embodiment. Numerous other changes, substitutions, variations, alterations, and modifications may be ascertained to one skilled in the art and it is intended that the present disclosure encompass all such changes, substitutions, variations, alterations, and modifications as falling within the scope of the appended claims.

What is claimed is:

1. An apparatus comprising:
a receiver;
one or more processors in communication with the receiver; and,
memory in communication with the one or more processors, the memory comprising code that, when executed, causes the one or more processors to control the apparatus to:
receive a first data stream from a network, the first data stream originating at a source device and addressed to a destination device;
receive a second data stream, wherein the second data stream is a code shortened version of the first data stream originating at the source device;
combine the first data stream and the second data stream based on redundancy provided by the second data stream to generate a third data stream; and,
provide the third data stream for processing.

2. The apparatus of claim 1, wherein the code is further executable to cause the one or more processors to control the apparatus to combine the first data stream and the second data stream by controlling the apparatus to:
decode the first data stream to generate a fourth data stream;
decode the second data stream to generate a fifth data stream; and,
combine the fourth data stream and the fifth data stream based on redundancy provided by the fifth data stream to generate the third data stream.

3. The apparatus of claim 1, wherein the code is further executable to cause the one or more processors to control the apparatus to combine the first data stream and the second data stream by controlling the apparatus to:
combine the first data stream and the second data stream based on the redundancy provided by the second data stream to generate a fourth data stream; and,
decode the fourth data stream to generate the third data stream.

4. The apparatus of claim 3, wherein a plurality of bits of the first data stream and a plurality of bits of the second data stream are each assignable to one of a plurality of bit locations, and the code is further executable to cause the one or more processors to control the apparatus to combine the first data stream and the second data stream by controlling the apparatus to:
determine at least one selected bit location of the plurality of bit locations in the second data stream for which no bit was received; and
combine the bits of the first data stream and the bits of the second data stream at each of the plurality of bit locations based on a selected combining method to generate the fourth data stream, wherein the bits of the first data stream in the selected bit location in the first data stream are placed in the selected bit location in the fourth data stream.

5. The apparatus of claim 3, wherein a plurality of bits of the first data stream and a plurality of bits of the second data stream are each assignable to one of a plurality of bit locations, and the code is further executable to cause the one or more processors to control the apparatus to combine the first data stream and the second data stream by controlling the apparatus to:
determine a quality value for each bit of the first data stream and second data stream; and
combine the bits of the first data stream and the bits of the second data stream by taking the bit having the higher quality value of the bits of the first data stream or second data stream at each of the plurality of bit locations and placing the bit having the higher quality value in each of the plurality of bit locations in the fourth data stream.

6. The apparatus of claim 1, wherein the apparatus is the destination device.

7. The apparatus of claim 1, wherein the code is further executable to cause the one or more processors to control the apparatus to combine the first data stream and the second data stream by controlling the apparatus to:
decode the first data stream to generate a fourth data stream using a type of decoder used at the source device to encode the first data stream;
decode the second data stream to generate a fifth data stream using the type of decoder used at the source device to encode the first data stream; and,
combine the fourth data stream and the fifth data stream based on redundancy provided by the fifth data stream to generate the third data stream.

8. The apparatus of claim 1, wherein the code is further executable to cause the one or more processors to control the apparatus to determine that the first data stream and the second data stream originate at the same source device using a source address.

9. A method comprising:
receiving a first data stream via a network, the first data stream originated at a source device and addressed to a destination device;
receiving a second data stream, wherein the second data stream is a code shortened version of the first data stream originating at the source device;

combining the first data stream and the second data stream based on redundancy provided by the second data stream to generate a third data stream; and providing the third data stream for processing.

10. The method of claim 9, wherein the combining the first and second data streams comprises:

decoding the first data stream to generate a fourth data stream; and decoding the second data stream to generate a fifth data stream; and, combining the fourth data stream and the fifth data stream based on redundancy in the fifth data stream to generate the third data stream.

11. The method of claim 10, wherein the first and second data streams are decoded using the same error correction coding as the first data stream is encoded at the source device.

12. The method of claim 9, wherein the combining the first and second data streams comprises:

combining the first and second data streams based on redundancy in the second data stream to generate a fourth data stream; and decoding the fourth data stream to generate the third data stream.

13. The method of claim 12, wherein the combining the first and second data streams comprises:

assigning the plurality of bits of the first data stream to a plurality of bit locations, respectively;

assigning the plurality of bits of the second data stream to the plurality of bit locations, respectively;

determining one or more bit locations that correspond to one or more missing bits of the second data stream, respectively; and combining the bits of the first and second data streams assigned to the same bit location to generate the fourth data stream, wherein one or more bits of the first data stream corresponding to the one or more missing bits of the second data stream are selected for one or more data bit locations, respectively, in the fourth data stream.

14. The method of claim 12, wherein the combining the first and second data streams comprises:

assigning the plurality of bits of the first data stream to a plurality of bit locations, respectively;

assigning the plurality of bits of the second data stream to the plurality of bit locations, respectively;

determining a quality value for each bit of the first data stream and second data stream; and selecting one of the bits of the first and second data streams that is assigned to the same bit location and has a higher quality value, to generate the fourth data stream.

15. The method of claim 9, further comprising determining whether the first and second data streams are originated from the same source device based on a source address.

* * * * *